(12) United States Patent
Takeshima et al.

(10) Patent No.: US 12,094,138 B2
(45) Date of Patent: Sep. 17, 2024

(54) SEMICONDUCTOR INSPECTION DEVICE AND SEMICONDUCTOR INSPECTION METHOD

(71) Applicant: HAMAMATSU PHOTONICS K.K., Hamamatsu (JP)

(72) Inventors: Tomochika Takeshima, Hamamatsu (JP); Takafumi Higuchi, Hamamatsu (JP); Kazuhiro Hotta, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 406 days.

(21) Appl. No.: 17/608,833

(22) PCT Filed: Apr. 16, 2020

(86) PCT No.: PCT/JP2020/016739
§ 371 (c)(1),
(2) Date: Nov. 4, 2021

(87) PCT Pub. No.: WO2020/246149
PCT Pub. Date: Dec. 10, 2020

(65) Prior Publication Data
US 2022/0301197 A1  Sep. 22, 2022

(30) Foreign Application Priority Data
Jun. 3, 2019 (JP) .................................. 2019-103830

(51) Int. Cl.
G06T 7/30 (2017.01)
G06T 11/00 (2006.01)
G06F 30/392 (2020.01)

(52) U.S. Cl.
CPC ............... G06T 7/30 (2017.01); G06T 11/00 (2013.01); *G06F 30/392* (2020.01);
(Continued)

(58) Field of Classification Search
CPC . G06T 7/30; G06T 11/00; G06T 2207/20081; G06T 2207/30148;
(Continued)

(56) References Cited

U.S. PATENT DOCUMENTS

2012/0076395 A1  3/2012 Khurana
2017/0148226 A1*  5/2017 Zhang .................. G06T 9/00
(Continued)

FOREIGN PATENT DOCUMENTS

JP  2009-162718 A  7/2009
JP  2019-129169 A  8/2019
(Continued)

OTHER PUBLICATIONS

International Preliminary Report on Patentability mailed Dec. 16, 2021 for PCT/JP2020/016739.

*Primary Examiner* — Christopher M Brandt
(74) *Attorney, Agent, or Firm* — Faegre Drinker Biddle & Reath LLP

(57) ABSTRACT

An observation system includes a detector that detects light from a semiconductor device and outputs a detection signal, a 2D camera, an optical device that guides light to the detector and the 2D camera, an image processing unit that generates a first optical image of the semiconductor device based on the detection signal and receives an input of a first CAD image, an image analysis unit that learns a conversion process of the first CAD image by machine learning using the first optical image as training data, and converts the first CAD image into a second CAD image resembling the first optical image by the conversion process based on a result of the learning, and an alignment unit that performs alignment based on a second optical image and the second CAD image.

10 Claims, 8 Drawing Sheets

(52) U.S. Cl.
CPC ............... *G06T 2207/20081* (2013.01); *G06T 2207/30148* (2013.01); *G06T 2210/32* (2013.01)

(58) Field of Classification Search
CPC ....... G06T 2210/32; G06T 2207/20084; G06T 7/001; G06F 30/392; G06N 3/045; G06N 3/08; G06N 3/04; G06N 20/00
See application file for complete search history.

(56) References Cited

U.S. PATENT DOCUMENTS

| | | |
|---|---|---|
| 2017/0193680 A1 | 7/2017 | Zhang et al. |
| 2017/0345140 A1 | 11/2017 | Zhang et al. |
| 2018/0293346 A1 | 10/2018 | Cilingiroglu et al. |
| 2018/0330511 A1 | 11/2018 | Ha et al. |

FOREIGN PATENT DOCUMENTS

| | | |
|---|---|---|
| TW | 201921151 A | 6/2019 |
| WO | WO-2015/098342 A1 | 7/2015 |

\* cited by examiner

SEMICONDUCTOR INSPECTION DEVICE AND SEMICONDUCTOR INSPECTION METHOD

TECHNICAL FIELD

The present disclosure relates to a semiconductor inspection device and a semiconductor inspection method for inspecting a semiconductor device.

BACKGROUND ART

Conventionally, an image has been acquired by using a semiconductor device as an inspection target device (DUT: device under test), and various analyses such as analysis of a faulty part have been performed based on the image (see Patent Literature 1 below and Patent Literature 2 below). For example, Patent Literature 1 below discloses that resolution of an optical image such as an LSM image is increased to generate a reconstructed image, a second CAD image is generated based on a plurality of layers of CAD data, and the reconstructed image is aligned with respect to a second CAD image. According to such a method, accurate alignment of optical images becomes possible.

CITATION LIST

Patent Literature

Patent Literature 1: U.S. Patent No. 2018/0293346
Patent Literature 1: International Publication WO 2015/098342

SUMMARY OF INVENTION

Technical Problem

In recent years, semiconductor devices to which various process rules are applied have become widespread. When a semiconductor device to which various process rules are applied is inspected by using the above-mentioned conventional method, it may be difficult to accurately align an optical image with respect to a CAD image.

An embodiment has been made in view of such a problem, and an object of the embodiment is to provide a semiconductor inspection device capable of accurately aligning an optical image acquired for a semiconductor device and a CAD image corresponding to the semiconductor device.

Solution to Problem

A semiconductor inspection device of an aspect of the present disclosure includes a photodetector configured to detect light from a semiconductor device and output a detection signal, an optical system configured to guide the light to the photodetector, an image generation unit configured to generate a first optical image which is an optical image of the semiconductor device based on the detection signal, a reception unit configured to receive an input of a first CAD image, an image conversion unit configured to learn a conversion process of the first CAD image by machine learning using the optical image as training data, and convert the first CAD image into a second CAD image resembling the optical image by the conversion process based on a result of the learning, and an alignment unit configured to perform alignment based on the optical image and the second CAD image.

Alternatively, a semiconductor inspection method of another aspect of the present disclosure includes a step of detecting light from a semiconductor device via an optical system and outputting a detection signal, a step of generating a first optical image which is an optical image of the semiconductor device based on the detection signal, a step of receiving an input of a first CAD image, a step of learning a conversion process of the first CAD image by machine learning using the optical image as training data, and converting the first CAD image into a second CAD image resembling the optical image by the conversion process based on a result of the learning, and a step of performing alignment based on the optical image and the second CAD image.

According to the one aspect or the other aspect, the optical image reflecting light from the semiconductor device and the first CAD image are acquired, the first CAD image is converted into the second CAD image resembling the optical image by the conversion process based on the result of learning by machine learning, and the second CAD image and the optical image are aligned with each other. In this way, when the semiconductor device to which various process rules are applied is targeted for inspection, the accuracy of alignment can be improved by converting the pattern on the CAD image so as to be closer to the optical image, and then performing alignment with the optical image.

A semiconductor inspection device according to another aspect of the present disclosure includes a photodetector configured to detect light from a semiconductor device and output a detection signal, an optical system configured to guide the light to the photodetector, an image generation unit configured to generate a first optical image which is an optical image of the semiconductor device based on the detection signal, a reception unit configured to receive an input of a first CAD image, an image conversion unit configured to learn a reconstruction process of the first optical image by machine learning using the first CAD image as training data, and reconstruct the first optical image into a second optical image resembling the first CAD image by the reconstruction process based on a result of the learning, and an alignment unit configured to perform alignment based on the second optical image and the first CAD image.

Alternatively, a semiconductor inspection method according to another aspect of the present disclosure includes a step of detecting light from a semiconductor device via an optical system and outputting a detection signal, a step of generating a first optical image which is an optical image of the semiconductor device based on the detection signal, a step of receiving an input of a first CAD image, a step of learning a reconstruction process of the first optical image by machine learning using the first CAD image as training data, and reconstructing the first optical image into a second optical image resembling the first CAD image by the reconstruction process based on a result of the learning, and a step of performing alignment based on the second optical image and the first CAD image.

According to the other aspects, the optical image reflecting the light from the semiconductor device and the first CAD image are acquired, the optical image is converted into the second optical image resembling the first CAD image by the reconstruction process based on the result of the learning by machine learning, and the second optical image and the first CAD image are aligned. In this way, when the semiconductor device to which various process rules are applied is targeted for inspection, the accuracy of alignment can be improved by converting an unclear part on the optical image so as to be closer to the CAD image, and then performing alignment with the CAD image.

Advantageous Effects of Invention

According to an embodiment, it is possible to accurately align an optical image acquired for a semiconductor device and a CAD image corresponding to the semiconductor device.

DESCRIPTION OF EMBODIMENTS

Hereinafter, an embodiment of the present disclosure will be described in detail with reference to the accompanying drawings. Note that in the description, the same reference symbols will be used for the same elements or elements having the same function, and duplicate description will be omitted.

Figure 1:
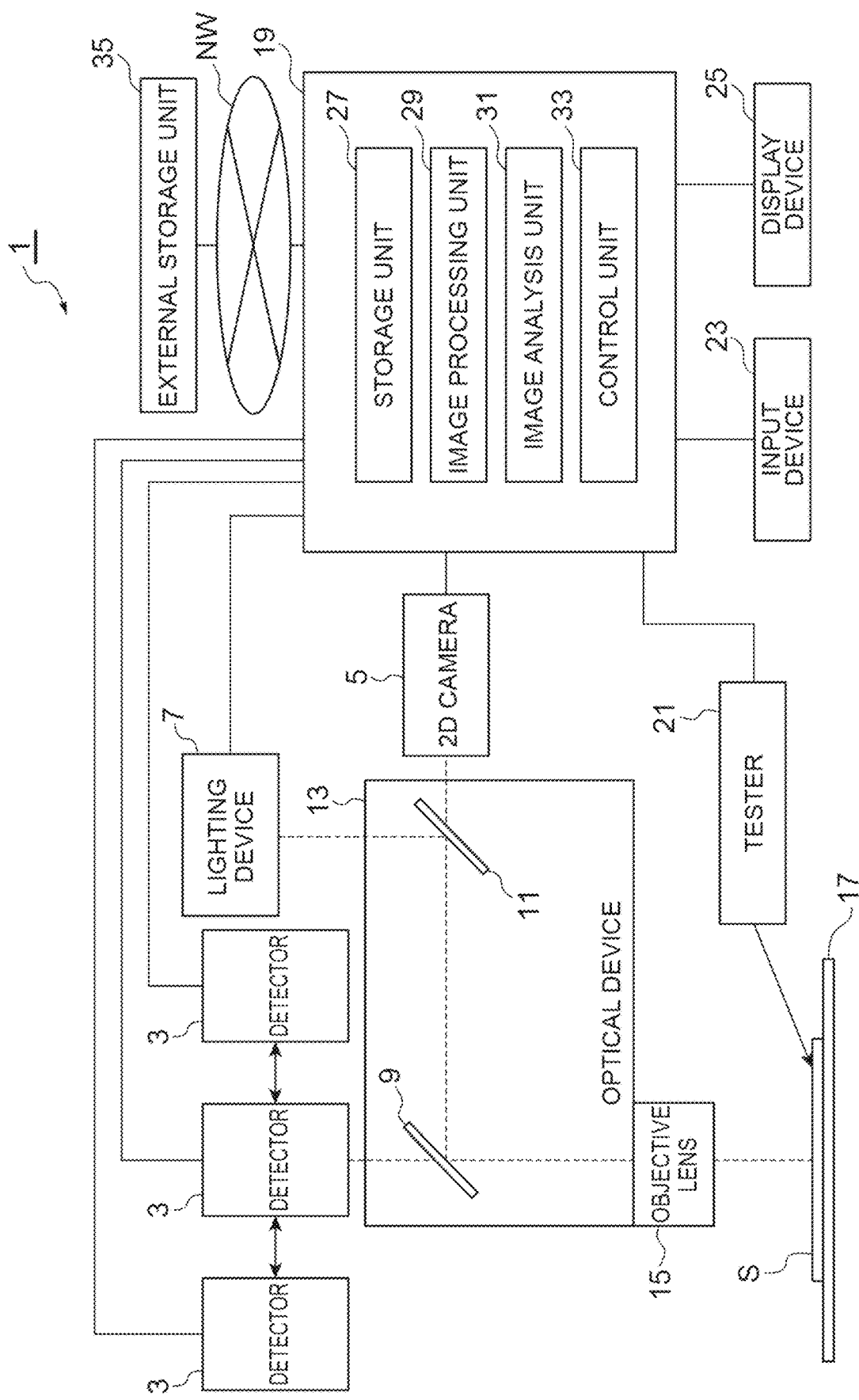
FIG. 1 is a schematic configuration diagram of an observation system 1 according to an embodiment.

FIG. 1 is a schematic configuration diagram of an observation system 1 which is a semiconductor inspection device according to an embodiment. The observation system 1 illustrated in FIG. 1 is an optical system that acquires and processes an image such as a heat generation image of a semiconductor device such as a logic LSI, an integrated circuit (IC) such as a memory, or a power device to inspect the semiconductor device. The observation system 1 includes a plurality of detectors 3, a two-dimensional (2D) camera 5, a lighting device 7, an optical device (optical system) 13 incorporating a dichroic mirror 9 and a beam splitter 11 such as a half mirror, an objective lens 15, a stage 17, a computer (personal computer) 19, a tester 21, an input device 23, and a display device 25.

Each of the plurality of detectors 3 is a photodetector that detects light from a semiconductor device S placed on the stage 17. For example, the detector 3 may be an imaging device such as an indium gallium arsenide (InGaAs) camera or an indium antimonide (InSb) camera having sensitivity to infrared wavelengths. Further, the detector 3 may be a detection system that detects reflected light while two-dimensionally scanning laser light on the semiconductor device S, thereby outputting a detection signal for acquiring a laser scanning microscope (LSM) image or an electro optical frequency mapping (EOFM) image. Each of the plurality of detectors 3 is switched so as to be optically connectable to the optical device 13, and detects light from the semiconductor device S via the objective lens 15 and the dichroic mirror 9 in the optical device 13.

The 2D camera 5 is a camera incorporating a charge coupled device (CCD) image sensor, a complementary metal-oxide semiconductor (CMOS) image sensor, etc., and a photodetector that detects reflected light from the semiconductor device S placed on the stage 17 and outputs a detection signal for a 2D pattern image of the semiconductor device. The 2D camera 5 detects the 2D pattern image of the semiconductor device S via the objective lens 15, and the dichroic mirror 9 and the beam splitter 11 in the optical device 13.

The objective lens 15 is provided so as to face the semiconductor device S, and sets the magnification of an image formed on the plurality of detectors 3 and the 2D camera 5. The objective lens 15 includes a plurality of built-in lenses having different magnifications, and has a function of switching the built-in lens forming images on the detectors 3 or the 2D camera 5 between a high-magnification lens and a low-magnification lens.

The dichroic mirror 9 transmits light in a predetermined wavelength range in order to guide an image such as a light emission image, a heat generation image, or a reflection image of the semiconductor device S to the detector 3, and reflects light having a wavelength other than the predetermined wavelength range in order to guide the 2D pattern image of the semiconductor device S to the 2D camera 5. The beam splitter 11 transmits the pattern image reflected by the dichroic mirror 9 toward the 2D camera 5, and reflects illumination light for generating the 2D pattern image emitted from the lighting device 7 toward the dichroic mirror 9, thereby irradiating the semiconductor device S with the illumination light via the dichroic mirror 9 and the objective lens 15.

The tester 21 applies a predetermined electric signal test pattern, a predetermined voltage, or a predetermined current to the semiconductor device S. By applying this test pattern, light emission or heat generation due to a failure of the semiconductor device S occurs.

The computer 19 is an image processing device (processor) that processes the detection signal acquired by the detectors 3 and the 2D camera 5. Specifically, the computer 19 includes a storage unit 27, an image processing unit (reception unit and image generation unit) 29, an image analysis unit (image conversion unit, alignment unit, and output unit) 31, and a control unit 33 as functional components. Further, the computer 19 is provided with the input device 23 such as a mouse or keyboard for inputting data to the computer 19, and the display device (output unit) 25 such as a display for displaying an image processing result by the computer 19.

Each functional unit of the computer 19 illustrated in FIG. 1 is a function implemented by an arithmetic processing device such as a CPU of the computer 19 executing a computer program (image processing program) stored in a storage medium such as an internal memory of the computer 19 or a hard disk drive. The arithmetic processing device of the computer 19 causes the computer 19 to function as each functional unit of FIG. 1 by executing this computer program, and sequentially executes semiconductor inspection processes described later. Various data necessary for executing the computer program and various data generated by executing the computer program are all stored in the internal memory such as ROM or RANI of the computer 19 or a storage medium such as a hard disk drive.

Here, a function of each functional unit of the computer 19 will be described.

The storage unit 27 stores a measurement image in which a light emission image, a heat generation image, etc. acquired by the detector 3 is detected, a first optical image in which the pattern image of the semiconductor device S acquired by the detector 3 or the 2D camera 5 is detected, and a first CAD image showing a high-resolution pattern of the semiconductor device S created based on CAD data acquired from the outside. The first optical image is an image showing an optical measurement result of a 2D pattern of the semiconductor device S, and may be an image of a 2D pattern detected by the 2D camera 5, or an LSM image based on a detection signal detected by the detector 3. The image processing unit 29 sequentially generates the measurement image and the first optical image based on the detection signal received from the detectors 3 or the 2D camera 5, and sequentially stores the measurement image and the first optical image in the storage unit 27. Further, the image processing unit 29 receives input of CAD data from an external storage unit 35 constructed in an external PC, a server device, etc. via a network NW, generates a first CAD image from the CAD data, and causes the storage unit 27 to store the generated first CAD image. This CAD data is generated by software referred to as a layout viewer stored in an external PC, a server device, etc. based on design information related to layout of respective layers such as a diffusion layer, a metal layer, a gate layer, and an element separation layer of the semiconductor device S. This CAD data is used as the first CAD image showing the pattern image of the semiconductor device S.

The control unit 33 controls data processing in the computer 19 and processing of a device connected to the computer 19. Specifically, the control unit 33 controls emission of illumination light by the lighting device 7, imaging by the plurality of detectors 3 and the 2D camera 5, switching connection of the plurality of detectors 3 to the optical device 13, switching the magnification of the objective lens 15, application of test pattern by the tester 21, display of an observation result by the display device 25, etc.

The image analysis unit 31 performs a reconstruction process, a pattern conversion process, and an alignment process on various images sequentially stored in the storage unit 27. Details of a function of each process of the image analysis unit 31 will be described below.

The image analysis unit 31 generates a second optical image resembling the first CAD image based on the first optical image described in the storage unit 27 (reconstruction process). This reconstruction process is executed using a learning model obtained as a result of pre-learning by deep learning, which is a type of machine learning, by setting a plurality of first optical images as training data, and the first CAD image corresponding to the semiconductor device S targeted by the images as training data. Data of the learning model obtained by the pre-learning is stored in the storage unit 27 and is referred to during a subsequent reconstruction process. For example, as the learning model for deep learning, convolutional neural network (CNN), fully convolutional networks (FCN), U-Net, residual network (ResNet), etc. are used. However, the learning model is not limited to a specific one, and the number of nodes and the number of layers in the learning model can be arbitrarily set.

Figure 2:
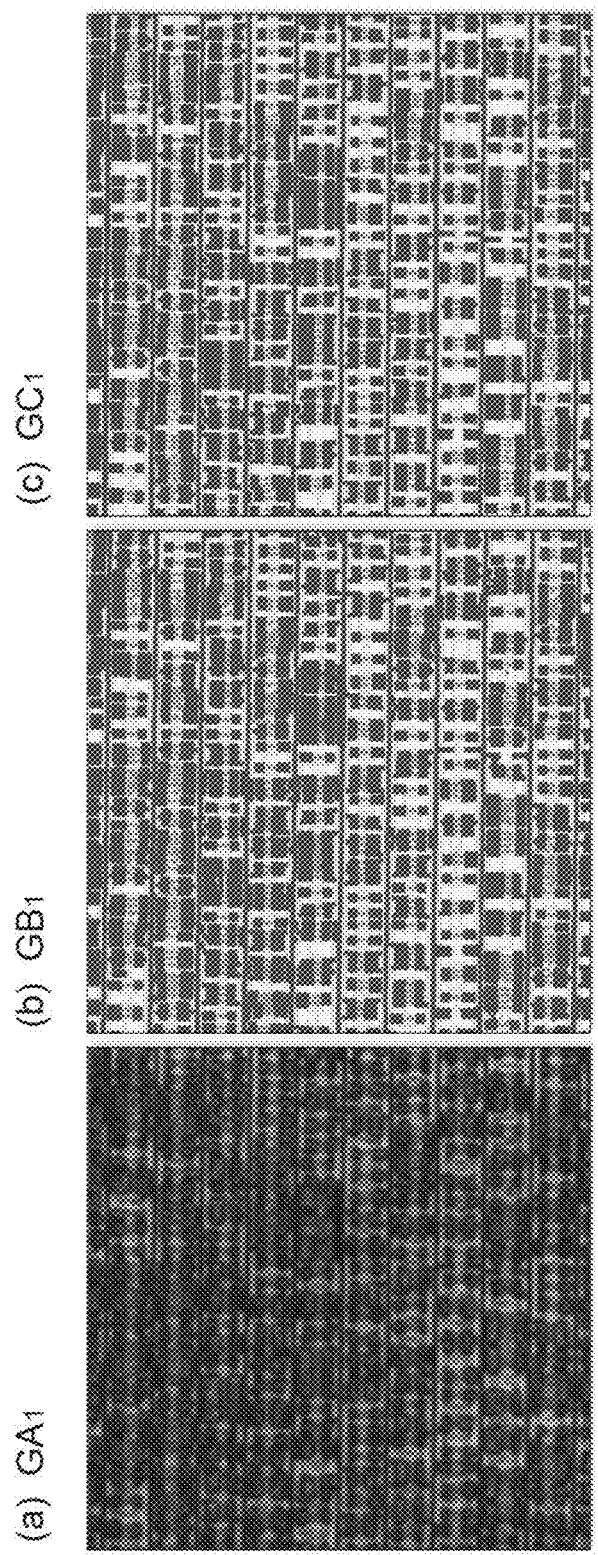
FIG. 2(a) is a diagram illustrating an example of a first optical image which is a target of a reconstruction process.
FIG. 2(b) is a diagram illustrating an example of a second optical image generated by the reconstruction process targeting the first optical image of FIG. 2(a)
FIG. 2(c) is a diagram illustrating an example of a first CAD image corresponding to the first optical image of FIG. 2(a).

FIG. 2 illustrates an example of an image processed by the image analysis unit 31. FIG. 2(a) illustrates a first optical image $GA_1$, which is an LSM image corresponding to a target of the reconstruction process, FIG. 2(b) illustrates a second optical image $GB_1$ generated by the reconstruction process targeting the first optical image $GA_1$ of FIG. 2(a), and FIG. 2(c) illustrates a first CAD image $GC_1$ corresponding to the first optical image of FIG. 2(a), respectively. In this way, a low-resolution and unclear part of the first optical image $GA_1$ is converted by the reconstruction process so as to be closer to the first CAD image $GC_1$, and the second optical image $GB_1$ resembling the first CAD image $GC_1$ as a whole is generated.

Further, the image analysis unit 31 generates a second CAD optical image resembling the first optical image based on the first CAD image described in the storage unit 27 (pattern conversion process). This pattern conversion process is executed using a learning model obtained as a result of pre-learning by deep learning by setting a plurality of first CAD images as training data, and the first optical image acquired for the semiconductor device S corresponding to these images as training data. For pre-learning, a plurality of combinations of a first optical image, obtained by cutting out an arbitrary range on the semiconductor device S and performing an enlargement process, and a first CAD image, obtained by cutting out a position corresponding to the range and performing an enlargement process, is used. Data of the learning model obtained by such pre-learning is stored in the storage unit 27 and is referred to during a subsequent pattern conversion process. Similar to the above description, as the learning model for deep learning, CNN, FCN, U-Net, ResNet, etc. are used. However, the learning model is not limited to a specific one, and the number of nodes and the number of layers in the learning model can be arbitrarily set.

Figure 3:
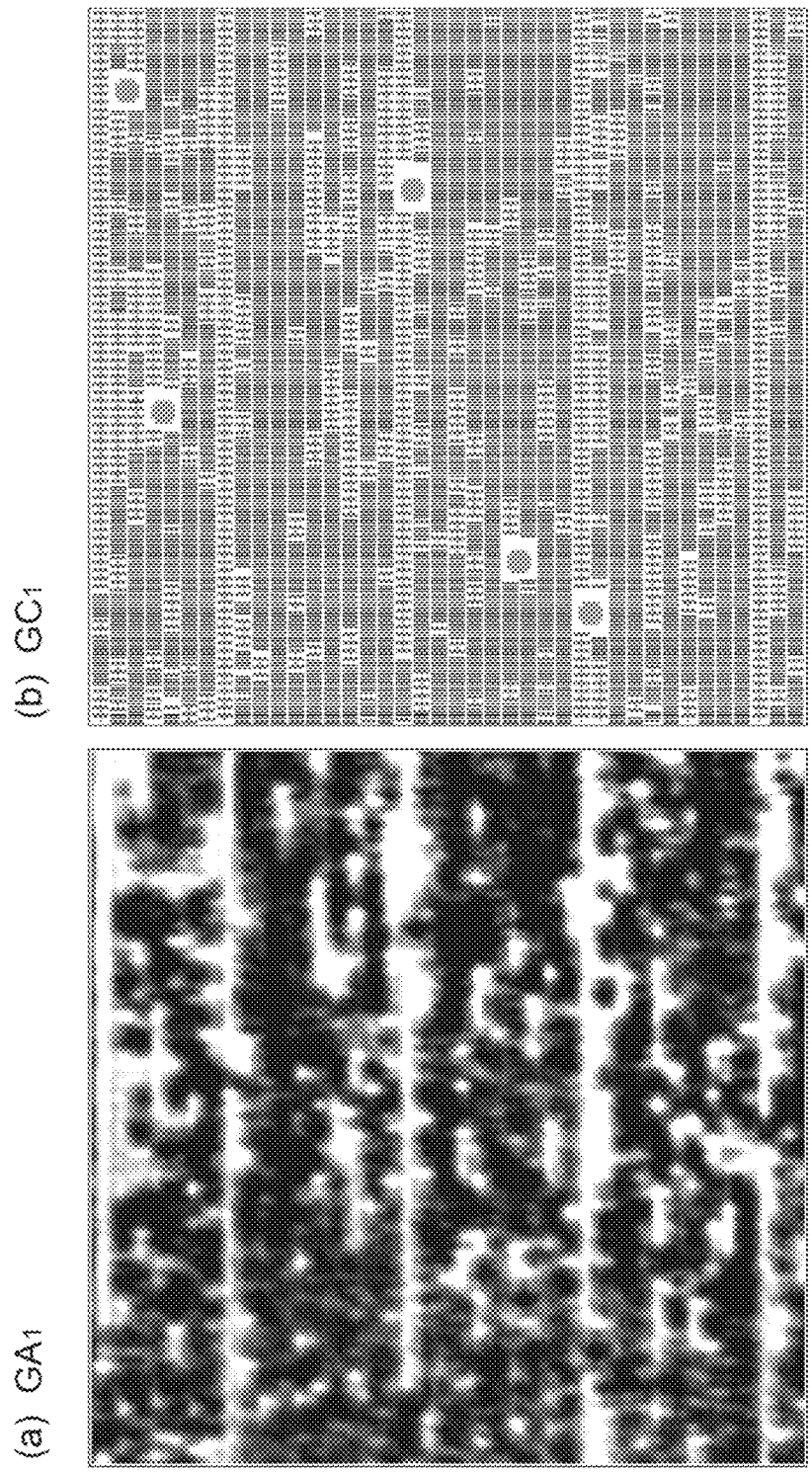
FIG. 3(a) is a diagram illustrating an example of the first optical image stored in a storage unit 27 of FIG. 1.
FIG. 3(b) is a diagram illustrating the first CAD image corresponding to the first optical image of FIG. 3(a) stored in the storage unit 27 of FIG. 1.

FIG. 3(a) illustrates an example of the first optical image $GA_1$, which is an LSM image stored in the storage unit 27, and FIG. 3(b) illustrates the first CAD image $GC_1$ representing a pattern image of the semiconductor device S corresponding to the first optical image $GA_1$ of FIG. 3(a). In this way, in an image observed in the first optical image $GA_1$, not all patterns of the first CAD image $GC_1$ appear, and patterns of some layers (gate layer, diffusion layer under the gate layer and element separation layer, etc.) mainly appears. Further, in the first optical image $GA_1$, depending on the crowded condition of the patterns of the first CAD image $GC_1$, a gray image may appear in a part corresponding to the pattern.

Figure 4:
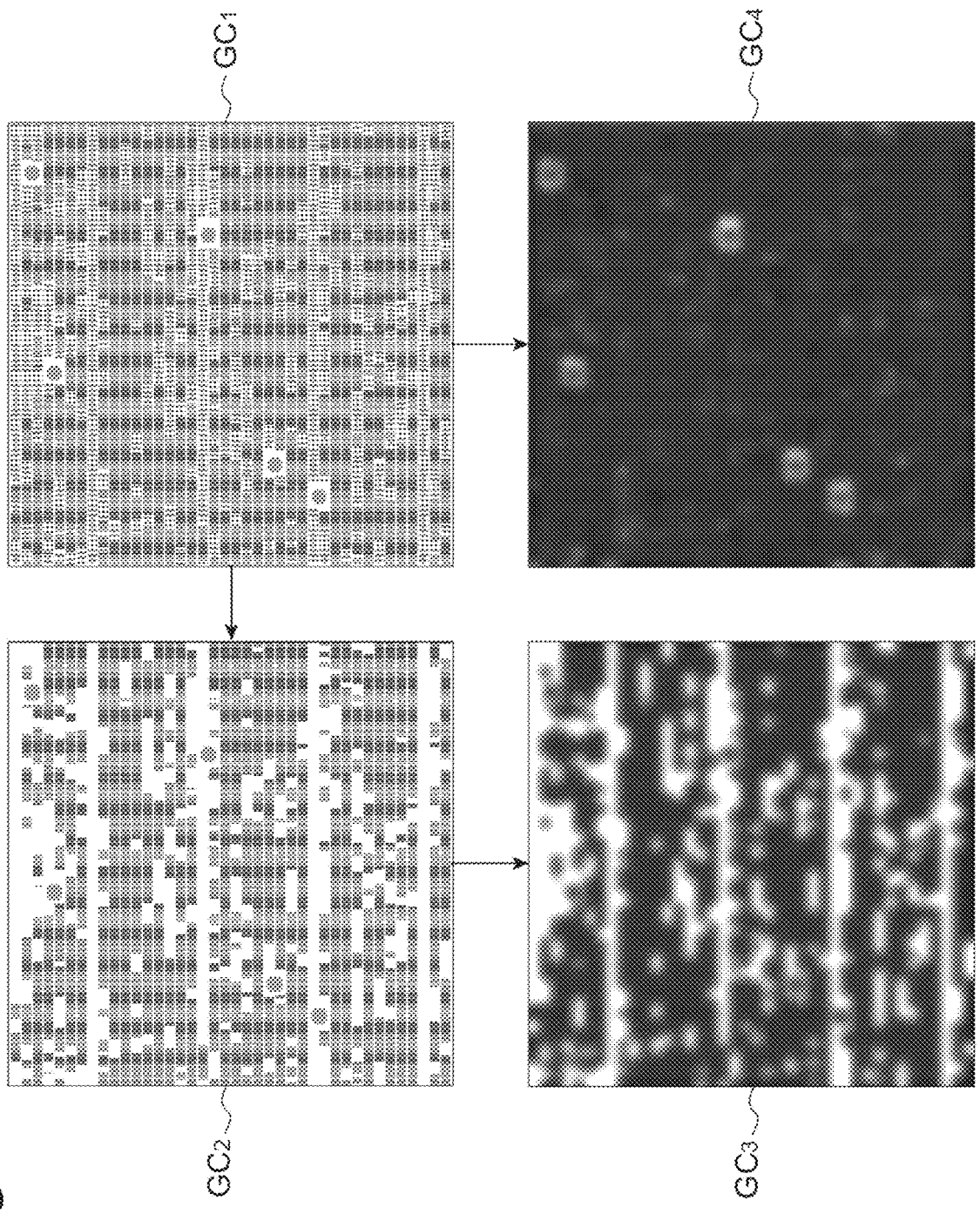
FIG. 4 is a diagram illustrating an image of an image generated by a pattern conversion process targeting a first CAD image $GC_1$ by an image analysis unit 31 of FIG. 1.

FIG. 4 illustrates an image of an image generated by the image analysis unit 31 through a pattern conversion process targeting the first CAD image $GC_1$. The image analysis unit 31 generates a second CAD image $GC_2$ by performing a pattern conversion process on the first CAD image $GC_1$ in advance, and further generates a third CAD image $GC_3$ by performing a predetermined image correction process, that is, Gaussian blur and gamma correction on the second CAD image $GC_2$. Further, an image $GC_4$ is an image when a predetermined image correction process is directly applied to the first CAD image $GC_1$. In this way, in the second CAD image $GC_2$ subjected to the pattern conversion process, some predetermined patterns are deleted to obtain an image closer to the first optical image $GA_1$ (FIG. 3(a)). As a result, the entire image of the third CAD image $GC_3$ generated by applying a blurring process, etc. to the second CAD image $GC_2$ is close to the image of the first optical image $GA_1$. On the other hand, the image $GC_4$ obtained by directly applying the blurring process, etc. to the first CAD image $GC_1$ is converted into an image whose overall contrast is weak, and is far from the image of the first optical image $GA_1$.

Figure 5:
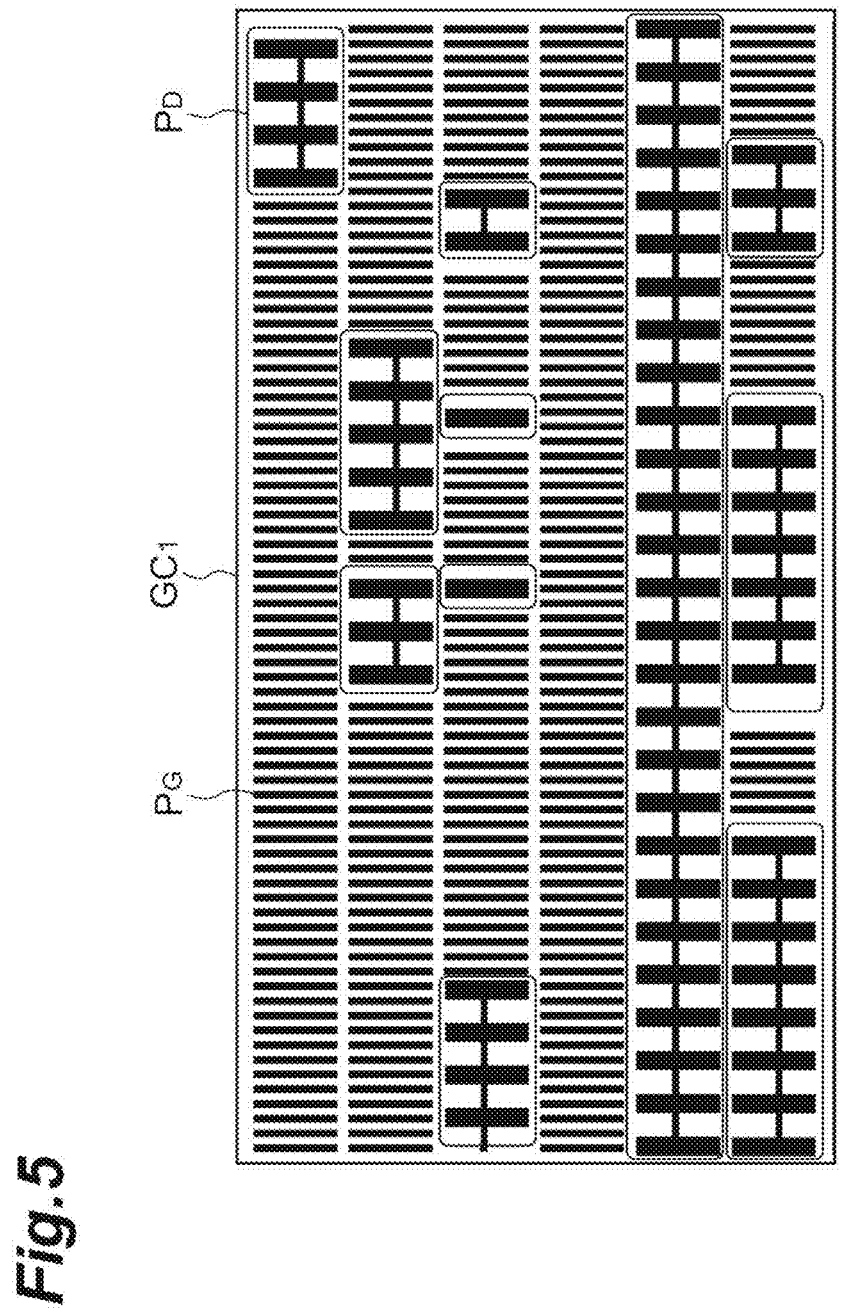
FIG. 5 is a diagram illustrating an image of the pattern conversion process by the image analysis unit 31 of FIG. 1 using the first CAD image $GC_1$.

FIG. 5 illustrates an image of the pattern conversion process by the image analysis unit 31 using the first CAD image $GC_1$. The first optical image, which is an observation result of light from the surface of the semiconductor device S, generally reflects a pattern $P_G$ of the gate layer. However, a dummy pattern $P_D$ is less likely to appear on the first optical image $GA_1$ depending on the process rule of the semiconductor device S. The image analysis unit 31 can construct a process of extracting the dummy pattern $P_D$ from the first CAD image $GC_1$ as a learning model by pre-learning. In this way, the image analysis unit 31 can perform conversion to the second CAD image $GC_2$ by deleting the dummy pattern $P_D$ on the first CAD image $GC_1$.

In order to convert the CAD image into an image similar to the optical image in this way, special preprocessing is required in normal operation. On the other hand, by applying machine learning, such preprocessing is automatically executed. By machine learning, it is determined that it is appropriate to display the dummy pattern $P_D$ as described above as a bright spot in order to resemble an optical image, and it is determined that it is appropriate to display other gate patterns with a fine pitch as dark spots in order to resemble an optical image. Meanwhile, depending on the device rule, it may not be appropriate that the dummy pattern formed on the gate layer is optically brightly displayed, and in some cases it is appropriate that the dummy pattern is darkly displayed. By performing machine learning using the CAD image and the optical image at the same spot of the semiconductor device S, it is possible to automatically execute preprocessing by making the two images correspond to each other regardless of the device rule.

Note that in recent advanced devices, the diffusion layer and the element separation layer disposed below the gate may cause contrast of the pattern $P_G$ rather than the pattern of the gate. In this case, the optical image is formed from different layers according to the change in the structure of the semiconductor device for each generation. In this way, in advanced devices, a difference between the diffusion layer and the element separation layer may cause the pattern contrast in the optical image, and thus it is necessary to preprocess the CAD image after extracting information of a layer to be appropriately machine-learned.

Further, the image analysis unit 31 executes alignment with respect to mutual image positions by pattern matching between images based on the second optical image $GB_1$ generated by the reconstruction process described above, and the third CAD image $GC_3$ corresponding to a range of the second optical image $GB_1$ on the semiconductor device S generated by the pattern conversion process described above. Then, the image analysis unit 31 superimposes a measurement image in which light emission, heat generation, etc. are detected by measuring the same range as the first optical image $GA_1$ and the first CAD image $GC_1$ using an alignment result and causes the display device 25 to display the images.

Figure 6:
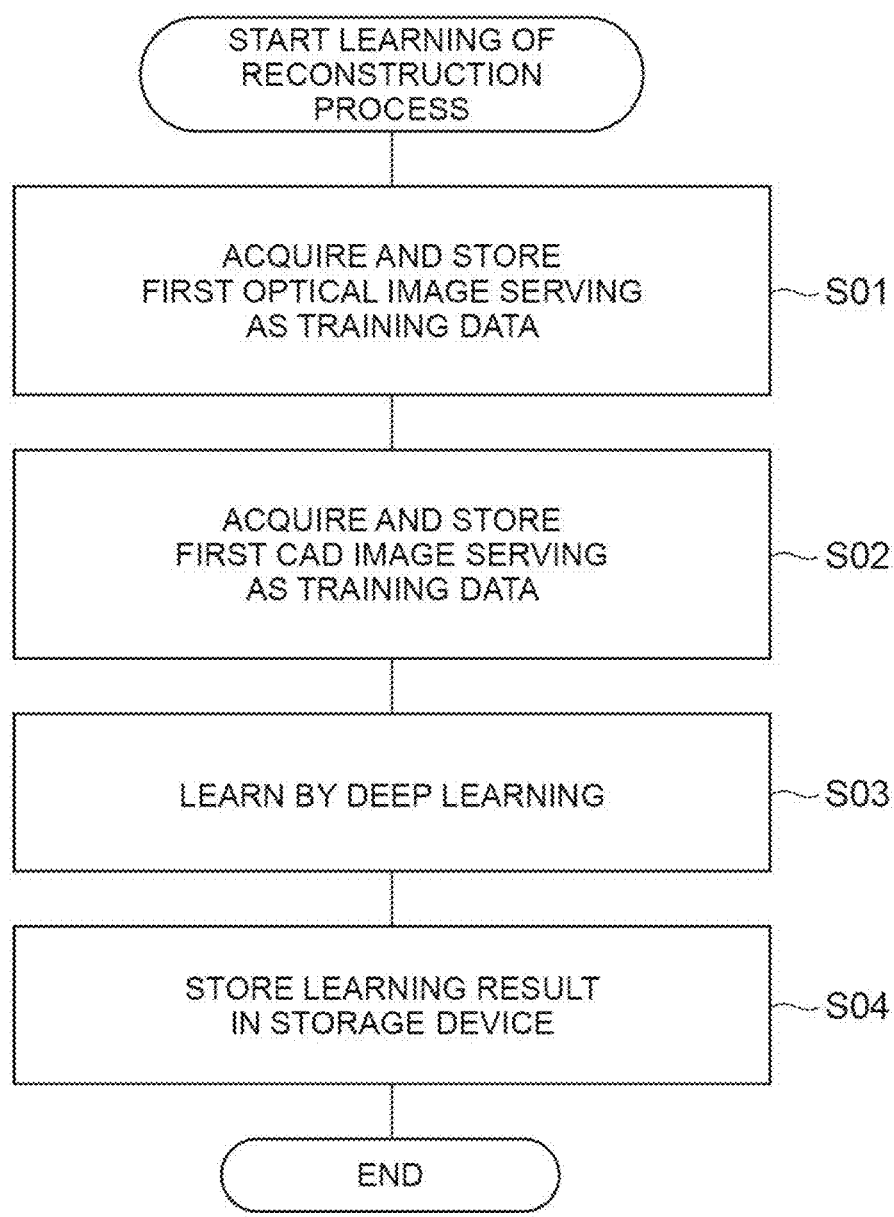
FIG. 6 is a flowchart illustrating a flow of a process of pre-learning for generating a learning model of a reconstruction process by the observation system 1.

Next, a procedure of processing of the semiconductor inspection method executed by the observation system 1 will be described with reference to FIGS. 6 to 8. FIG. 6 is a flowchart illustrating a flow of processing of pre-learning for generating a learning model of the reconstruction process, FIG. 7 is a flowchart illustrating a flow of processing of pre-learning for generating a learning model of the pattern conversion process, and FIG. 8 is a flowchart illustrating a flow of analysis processing of the semiconductor device S.

First, referring to FIG. 6, when the computer 19 starts learning of the reconstruction process at an arbitrary timing such as a user operation, the detectors 3, the 2D camera 5, the lighting device 7, etc. are controlled, so that a plurality of first optical images of the semiconductor device S serving as training data is acquired and stored in the storage unit 27 (step S01). Subsequently, a plurality of pieces of CAD data corresponding to the first optical image is acquired from the outside by the computer 19, and the first CAD image serving as training data is acquired based on the CAD data and the image is stored in the storage unit 27 (step S02). Thereafter, using a plurality of combinations of the first optical image and the first CAD image stored in the storage unit 27, the image analysis unit 31 of the computer 19 constructs a learning model of the reconstruction process by deep learning (step S03). As a result, data of the learning model acquired by the image analysis unit 31 is stored in the storage unit 27 (step S04).

Figure 7:
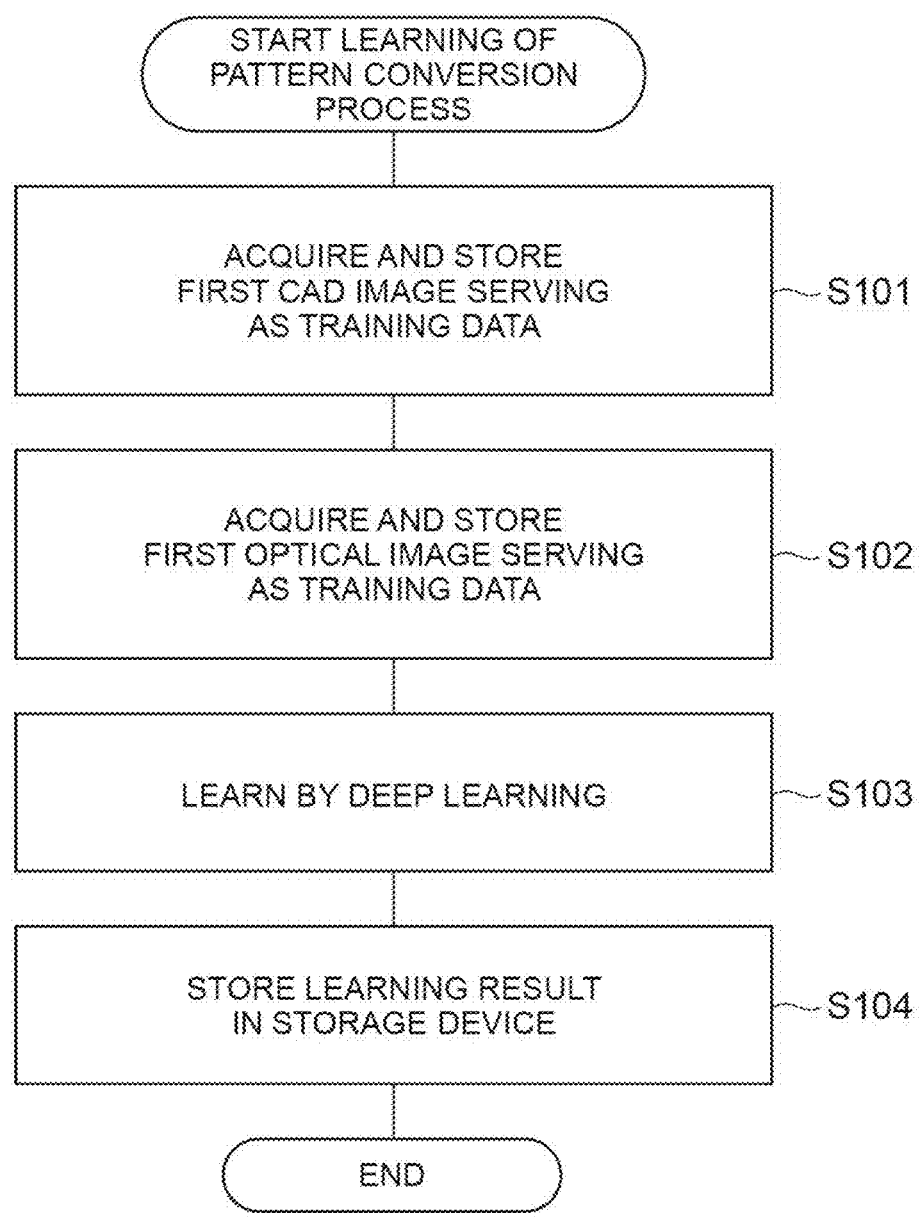
FIG. 7 is a flowchart illustrating a flow of a process of pre-learning for generating a learning model of a pattern conversion process by the observation system 1.
Figure 8:
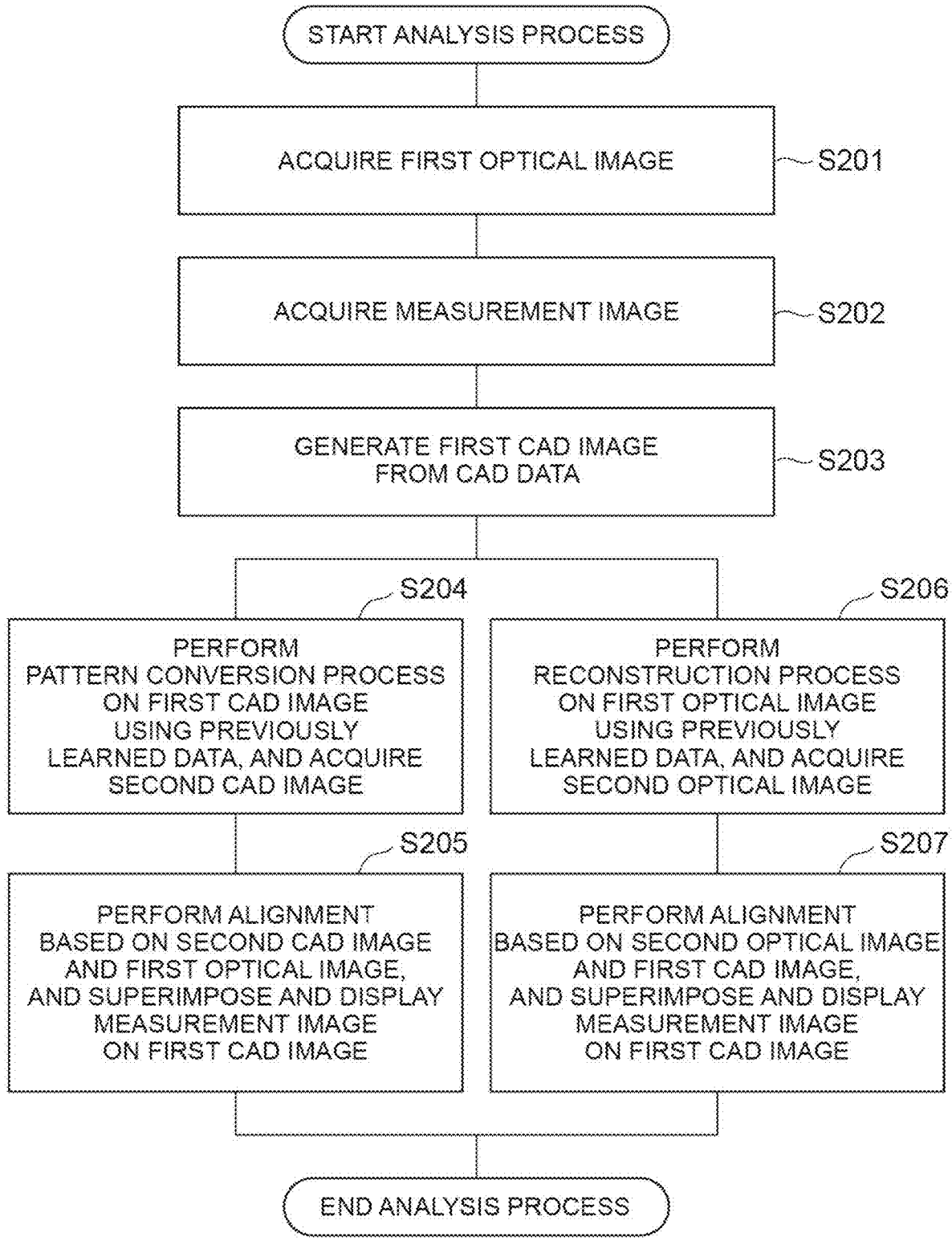
FIG. 8 is a flowchart illustrating a flow of an analysis process of a semiconductor device S by the observation system 1.

Referring to FIG. 7, when the computer 19 starts learning of the pattern conversion process at an arbitrary timing such as a user operation, a plurality of pieces of CAD data corresponding to a plurality of types of semiconductor devices S is acquired from the outside, and a plurality of first CAD images serving as training data is acquired based on the CAD data and stored in the storage unit 27 (step S101). Subsequently, when the detectors 3, the 2D camera 5, the lighting device 7, etc. are controlled by the computer 19, a plurality of first optical images corresponding to the first CAD image serving as training data is acquired and stored in the storage unit 27 (step S102). Thereafter, using a plurality of combinations of the first CAD image and the first optical image stored in the storage unit 27, the image analysis unit 31 of the computer 19 constructs a learning model of the pattern conversion process by deep learning (step S103). As a result, data of the learning model acquired by the image analysis unit 31 is stored in the storage unit 27 (step S104).

A description will be given of a procedure of analysis processing of the semiconductor device S after construction of a learning model of the reconstruction process and a learning model of the pattern conversion process with reference to FIG. 8. First, when the detectors 3, the 2D camera 5, the lighting device 7, etc. are controlled by the computer 19, the first optical image and the measurement image for the semiconductor device S are acquired and stored in the storage unit 27 (step S201, step S202). Then, CAD data of the semiconductor device S is acquired by the computer 19, and a first CAD image is generated based on the CAD data and stored in the storage unit 27 (step S203). Thereafter, one of processes of steps S204 to S205 and processes of steps S206 to S207 is executed according to an input for selection of the user to the computer 19.

That is, the image analysis unit 31 of the computer 19 refers to the data of the learning model stored in the storage unit 27 and performs the pattern conversion process on the first CAD image, so that a second CAD image is acquired (step S204). Thereafter, the image analysis unit 31 performs alignment based on the first optical image and the third CAD image obtained by applying a predetermined image correction process to the second CAD image. Finally, the image analysis unit 31 superimposes the measurement image on the first CAD image and displays the images on the display device 25 using an alignment result (step S205).

Further, the image analysis unit 31 refers to the data of the learning model stored in the storage unit 27 and performs the reconstruction process on the first optical image, so that the second optical image is acquired (step S206). Thereafter, the image analysis unit 31 performs alignment based on the second optical image and the first CAD image. Finally, the image analysis unit 31 superimposes the measurement image on the first CAD image and displays the images on the display device 25 using an alignment result (step S207).

According to the observation system 1 according to the present embodiment described above, a first optical image reflecting light from the semiconductor device S and a first CAD image showing a pattern image of the semiconductor device S are acquired, the first CAD image is converted into a second CAD image resembling the first optical image by a conversion process based on a learning result by machine learning, and the second CAD image and the first optical image are aligned. In this way, when the semiconductor device S to which various process rules are applied is targeted for inspection, the accuracy of alignment can be improved by converting the pattern on the CAD image so as to be closer to the optical image, and then performing alignment with the optical image.

Further, according to the observation system 1, the first optical image is converted into the second optical image resembling the first CAD image by the reconstruction process based on a learning result by machine learning, and the second optical image and the first CAD image are aligned. In this way, when the semiconductor device S to which various process rules are applied is targeted for inspection, the accuracy of alignment can be improved by converting an unclear part on the optical image so as to be closer to the CAD image, and then performing alignment with the CAD image.

In particular, in the present embodiment, deep learning is adopted as machine learning. In this case, even when the semiconductor device S to which various process rules are applied is targeted for inspection, either one of the CAD image and the optical image can be effectively converted so as to be closer to the other.

In addition, in the present embodiment, learning is performed using the first optical image and the first CAD image at positions corresponding to each other on the semiconductor device S by the image analysis unit 31 of the computer 19. With such a function, it is possible to efficiently construct a conversion process or a reconstruction process for making either one of the CAD image and the optical image resemble the other, and it is possible to efficiently implement alignment.

Here, when a conversion process to which machine learning is not applied is used, a second CAD image can be generated by extracting a dummy pattern as a specific pattern from the first CAD image. For example, depending on the generation or type of the semiconductor device, the density of the dummy pattern and the density of the pattern other than the dummy are different, so that the contrast in the optical image may be different. In this case, it is necessary to convert the CAD image so as to resemble an optical image by matching the contrast of the dummy pattern. On the other hand, in the case of the conversion process to which machine learning is applied as in the present embodiment, by learning how the above dummy pattern is optically displayed, optimum conversion for getting closer to the optical image can be implemented even when the generation or type of semiconductor device changes, and thus highly accurate alignment can be efficiently implemented by the image analysis unit 31 that executes this conversion.

Further, the image analysis unit 31 of the present embodiment has a function of superimposing and outputting the measurement image obtained corresponding to the first optical image and the first CAD image based on an alignment result. With such a function, an inspection position in the measurement image can be easily visually recognized.

Even though various embodiments of the present disclosure have been described above, the present disclosure is not limited to the above embodiments, and may be modified or applied to another one without changing the gist described in each claim.

For example, the image analysis unit 31 of the embodiment superimposes and displays the measurement image and the first CAD image using the alignment result. However, only the first CAD image or the CAD data which is a basis of the first CAD image may be displayed. In this case, the computer 19 may have a function of setting an analysis position irradiated with light based on an alignment result on the displayed first CAD image or CAD data. Further, the computer 19 may have a function of superimposing and displaying a signal such as a light emission signal detected from the semiconductor device S on the CAD data based on the alignment result. By displaying the CAD data having high resolution in this way, the user can easily recognize the position.

In the embodiment, by the conversion process, a specific pattern may be extracted from the first CAD image to perform conversion into the second CAD image. In this way, the CAD image can be converted so as to effectively resemble the optical image, and highly accurate alignment can be efficiently implemented.

Here, the above-mentioned specific pattern may be a dummy pattern. In this case, more accurate alignment can be implemented.

In the embodiment, machine learning may be deep learning. In this case, even when a semiconductor device to which various process rules are applied is targeted for inspection, the image can be effectively converted so that either one of the CAD image and the optical image is brought closer to the other.

Further, learning may be performed using the first optical image and the first CAD image at positions corresponding to each other on the semiconductor device. When such a configuration is adopted, an image conversion process for making either one of the CAD image and the optical image resemble the other can be efficiently constructed, and efficient alignment can be implemented.

Further, it is possible to further include an output unit or a step to superimpose and output the image obtained corresponding to the first optical image and the first CAD image based on the alignment result. When such an output unit or step is included, an inspection position in the optical image can be easily visually recognized.

INDUSTRIAL APPLICABILITY

In the embodiment, a semiconductor inspection device and a semiconductor inspection method for inspecting a semiconductor device are used, and an optical image acquired for the semiconductor device and a CAD image corresponding to the semiconductor device can be accurately aligned.

REFERENCE SIGNS LIST

1: observation system, 3: detector (photodetector), 5: 2D camera (photodetector), 13: optical device (optical system), 19: computer, 29: image processing unit (reception unit, image generation unit), 31: image analysis unit (image conversion unit, alignment unit), S: semiconductor device.

The invention claimed is:

1. A semiconductor inspection device comprising:
    a photodetector configured to detect light from a semiconductor device and output a detection signal;
    an optical system configured to guide the light to the photodetector; and
    a circuitry,
    wherein the circuitry is configured to
    generate a first optical image which is an optical image of the semiconductor device based on the detection signal;
    receive an input of a first CAD image;
    learn a conversion process of the first CAD image by machine learning using the optical image as training data, and convert the first CAD image into a second CAD image resembling the optical image by the conversion process based on a result of the learning, and
    perform alignment based on the optical image and the second CAD image,
    wherein the circuitry performs conversion into the second CAD image by extracting a specific pattern from the first CAD image by the conversion process.

2. The semiconductor inspection device according to claim 1, wherein the specific pattern is a dummy pattern.

3. The semiconductor inspection device according to claim 1, wherein the machine learning is deep learning.

4. The semiconductor inspection device according to claim 1, wherein the circuitry learns using the first optical image and the first CAD image at positions corresponding to each other on the semiconductor device.

5. The semiconductor inspection device according to claim 1,
    wherein the circuitry superimposes and outputs an image obtained corresponding to the first optical image and the first CAD image based on a result of the alignment.

6. A semiconductor inspection method comprising:
    detecting light from a semiconductor device via an optical system and outputting a detection signal;
    generating a first optical image which is an optical image of the semiconductor device based on the detection signal;
    receiving an input of a first CAD image;
    learning a conversion process of the first CAD image by machine learning using the optical image as training data, and converting the first CAD image into a second CAD image resembling the optical image by the conversion process based on a result of the learning; and
    performing alignment based on the optical image and the second CAD image,
    wherein conversion into the second CAD image is performed by extracting a specific pattern from the first CAD image by the conversion process.

7. The semiconductor inspection method according to claim 6, wherein the specific pattern is a dummy pattern.

8. The semiconductor inspection method according to claim 6, wherein the machine learning is deep learning.

9. The semiconductor inspection method according to claim 6, wherein learning is performed using the first optical image and the first CAD image at positions corresponding to each other on the semiconductor device.

10. The semiconductor inspection method according to claim 6, further comprising
    a step of superimposing and outputting an image obtained corresponding to the first optical image and the first CAD image based on a result of the alignment.

* * * * *